US007183170B2

(12) United States Patent
Nakamura et al.

(10) Patent No.: US 7,183,170 B2
(45) Date of Patent: Feb. 27, 2007

(54) MANUFACTURING METHOD OF SEMICONDUCTOR DEVICE

(75) Inventors: Yoshitaka Nakamura, Tokyo (JP); Tsuyoshi Kawagoe, Tokyo (JP); Hiroshi Sakuma, Tokyo (JP); Isamu Asano, Tokyo (JP); Keiji Kuroki, Tokyo (JP); Hidekazu Goto, Tokyo (JP); Shinpei Iijima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/998,804

(22) Filed: Nov. 30, 2004

(65) Prior Publication Data

US 2005/0118762 A1 Jun. 2, 2005

(30) Foreign Application Priority Data

Dec. 1, 2003 (JP) ............................ 2003-401316

(51) Int. Cl.
*H01L 21/20* (2006.01)

(52) U.S. Cl. ..................... 438/386; 438/381; 438/387; 438/396; 257/E21.004; 257/E21.575

(58) Field of Classification Search ................ 438/381, 438/386, 387, 396; 257/E21.004, E21.575
See application file for complete search history.

(56) References Cited

U.S. PATENT DOCUMENTS

| | | | |
|---|---|---|---|
| 6,399,399 B2 * | 6/2002 | Yamamoto | 438/3 |
| 2003/0036243 A1 * | 2/2003 | Hironaka et al. | 438/396 |

FOREIGN PATENT DOCUMENTS

| | | |
|---|---|---|
| JP | 11-026722 | 1/1999 |
| JP | 2001-144266 | 5/2001 |
| JP | 2001-313379 | 11/2001 |

* cited by examiner

*Primary Examiner*—Michelle Estrada
*Assistant Examiner*—Fernando L. Toledo
(74) *Attorney, Agent, or Firm*—Young & Thompson

(57) ABSTRACT

After an upper electrode protective film is formed such that it is in a firm contact with ruthenium film of the upper electrode without damaging the ruthenium film, the upper electrode is etched, thereby, a MIM capacitor is obtained in which leak current is not increased due to oxidation of the ruthenium film of the upper electrode.

21 Claims, 22 Drawing Sheets

A
56
61
51
41
22
32
31
10
B

BEFORE EXPOSURE TO ETCHING ATMOSPHERE
AFTER EXPOSURE TO ETCHING ATMOSPHERE
RUTHENIUM FILM(20 nm thick)
TANTALUM OXIDE FILM(15 nm)
(a)
RUTHENIUM DIOXIDE (RuO2)
CAVITY
(c)
TANTALUM OXIDE FILM
RETHENIUM FILM
(b)
RUTHENIUM FILM DIOXIDE(RuO2)
CAVITY
(d)

FIG. 21

| | Film thickness | | Film formation method | | | | Coverage (*2) | Leak current (*1) | | Remarks |
|---|---|---|---|---|---|---|---|---|---|---|
| | | | Film formation atmosphere | | Film formation temperature | CVD type | | Heat treatment absent | After treatment with hydrogen 450°C, 30 minutes | |
| | | | CVD gas (*3) | Oxidation/ reduction | | | | | | |
| Reference | None | | | | | | | O | × | |
| Insulation film | Tantalum oxide film | $Ta_2O_5$ | PET, $O_2$ | Oxidation atmosphere | 440°C | Heat CVD method | O | O | O | |
| | Silicone oxide film | $SiO_2$ | TEO S, $O_2$ | Oxidation atmosphere | 400°C | Plasma CVD | × | × | × | |
| | Silicone nitride | $Si_3N_4$ | $SiH_2Cl_2$, $NH_3$ | Reduction atmosphere | 400°C | Plasma CVD | × | × | × | |
| | Aluminum oxide film | $Al_2O_3$ | TMA, $O_2$ | Oxidation atmosphere | 600°C | Heat CVD method | O | × | × | Ruthenium is oxidized |
| | Aluminum oxide film | $Al_2O_3$ | TMA, $O_3$ | Oxidation atmosphere | 400°C | Heat CVD method | O | O | Δ | Ruthenium is oxidized |
| Conductive film | Titan nitride film | TiN | TDMAT | Reduction atmosphere | 450°C | Heat CVD with plasma processing | × | × | × | |
| | Titan nitride film | TiN | $TiCL_4$, $NH_3$ | Reduction atmosphere | 500°C | Heat CVD | O | × | × | |
| | Tungsten film | W | $WF_6$, $H_2$ | Reduction atmosphere | 450°C | Heat CVD | O | × | × | |

(*1) judgment criterion for leak current (J)
O: J<1e -9A/cm$^2$ (@+1V, 90°C.) Δ: 1e-9 ≤ J ≤ 1e-8A/cm$^2$, ×: 1e-8A/cm$^2$ (*2) judgment criterion for coverage
coverage of hole bottom with respect to the top of a hole with aspect 20 (diameter: 100 nm, depth: 2000 nm) is O: ≥90%, ×: ≤90%

(*3) CVD gas
PET: penta ethoxy tantalum, Ta $(OC_2H_5)6$; TMA: trimethy aluminum, Al $(CH_3)_3$; TDMAT:Ti $[N(CH_3)_2]_3$.

MANUFACTURING METHOD OF SEMICONDUCTOR DEVICE

BACKGROUND OF THE INVENTION

1. Field of the Invention

The present invention relates to a manufacturing method of a semiconductor device and more particularly to a manufacturing method of a MIM type capacitor.

2. Description of Related Art

The memory cell of the dynamic random access memory (DRAM) comprises a selective transistor and a capacitor and with miniaturization of the memory cell accompanying a progress of fine processing technology, reduction in the charge accumulation quantity of the capacitor has been problematic. To solve this problem, researches for transforming the capacitor structure from metal insulator silicon (MIS) structure to metal insulator metal (MIM) structure with increasing an electrode surface area by fabricating a solid capacitor have been performed aggressively. Particularly, the MIM type capacitor using ruthenium (Ru) film as its electrode has attracted public attention as technology for mass production because ruthenium film chemical vapor deposition (CVD) technology and processing technology have advanced rapidly.

FIG. 2 is a longitudinal sectional view showing a typical conventional example of a memory cell having the MIM type capacitor. Two selective transistors are formed in an active region provided by sectioning the main surface of a silicon substrate 10 with a separating insulating film 2. Each selective transistor comprises a gate electrode 4 formed through a gate insulating film 3 on the main surface of the silicon substrate 10 and a pair of diffusion layer regions 5, 6 served as a source region and a drain region and the diffusion layer region 5 of the respective selective transistors is integrated and commonly used. In this selective transistor, a bit line 8 formed on interlayer insulation films 25, 26 and the diffusion layer region 5 are connected through a polysilicone plug 12 and a metal plug 7 which run through the interlayer insulation film 25. The bit line 8 is covered with the interlayer insulation film 21 and a capacitor is formed by laminating ruthenium film 41 as a lower electrode, ruthenium film 61 as an upper electrode and tantalum oxide film 51 as a capacity insulation film in a hole provided in the interlayer insulation film 22 formed on the interlayer insulation film 21. The lower electrode 41 is connected to a barrier metal film 32 on its bottom face and the barrier metal film 32 is connected to the polysilicone plug 11 through its bottom face via a contact metal film 31 and further, the polysilicone plug 11 is connected to the diffusion layer region 6 of the transistor through the polysilicone plug 12 located below. A first layer wiring 86 is formed on the ruthenium film 61 as the upper electrode and the first wiring 86 and the ruthenium film 61 are connected through a connection plug 81 formed by penetrating the interlayer insulation film 27.

A first conventional example of the manufacturing method of the MIM type capacitor in a memory cell shown in FIG. 2 will be described with reference to FIGS. 3–14. After a contact hole penetrating an interlayer insulation film 21 is filled with polysilicone film, a polysilicone plug 11 is formed by etching back (FIG. 3). Titan film and titan nitride film 32 acting as a barrier metal film are formed in a recess portion on the top face of the polysilicone plug 11. After that, titan silicide film 31 is formed by reacting the titan film with polysilicone through heat treatment in the atmosphere of nitrogen. Subsequently, the barrier metal film out of the recess is removed according to chemical mechanical polishing (CMP) method (FIG. 4). Next, the interlayer insulation film 22 is formed and a cylinder hole 92 penetrating the interlayer insulation film 22 is formed so as to expose the surface of the barrier metal film 32 on the bottom face of the cylinder hole 92 (FIG. 5).

Next, ruthenium film 41 is formed as a lower electrode according to spattering method and CVD method (FIG. 6). Then, photo resist film 99 is formed in the hole (FIG. 7) and the ruthenium film existing on the top portion of the hole is removed by etching back while protecting the ruthenium film in the hole (FIG. 8) and the lower electrode 41 is obtained by removing the photo resist film 99 (FIG. 9). Next, tantalum oxide film 51 is formed according to the CVD method and heat treatment is carried out to reform the tantalum oxide film 51 (FIG. 10). Subsequently, ruthenium film 61 is formed as an upper electrode according to the spattering method and CVD method (FIG. 11). This ruthenium film 61 is processed to the shape of the upper electrode according to photo lithography technology and dry etching technology (FIG. 12), and the interlayer insulation film 27 is formed (FIG. 13). The interlayer insulation film 27 is formed according to plasma CVD method using tetraethyl orthosilicate (TEOS) and oxygen ($O_2$) as material gas. Although this method has prevailed because the interlayer insulation film ($SiO_2$ film) can be formed at low cost and at low temperatures (≦400° C.), a cavity 95 is formed in the upper electrode because of insufficient coverage.

The ruthenium film is material of precious metal easy to process by dry etching and can be etched for example, in the atmosphere of oxygen, or mixture gas of chlorine and oxygen. However, if the ruthenium film is used as the lower electrode, it is partially oxidized during etching processing, thereby inducing a problem that leaks current increases. That is, if when part of the lower electrode turns to oxide of ruthenium, capacity insulation film is formed thereon, the oxide of ruthenium is altered, deformed or contracted during heat treatment for reformation of the capacity insulation film and as a consequence, stress is applied to the capacity insulation film thereby increasing leak current.

Japanese Unexamined Patent Publication (KOKAI) No.2001-313379 has described a method in which a second ruthenium film 43 serving as a buffer film (protective film) is grown selectively on the surface of a first ruthenium film 41 after the first ruthenium film is processed into the shape of the lower electrode, as a method for preventing increase in leak current originating from oxide of ruthenium. This method has attained a certain extent of effect in that deterioration of leak current characteristic of a capacitor originating from oxide on the surface of ruthenium film of the lower electrode is prevented (FIG. 14).

However, according to the conventional example shown in FIG. 14, although the increase in leak current originating from oxide on the surface of the lower electrode is prevented, an increase in leak current originating from oxidation of the upper electrode cannot be prevented. That is, although part of the ruthenium film is altered to oxide during etching processing of the upper electrode, the oxide is reduced to ruthenium film again in a process accompanying heat treatment in a reduction atmosphere after the formation of the capacitor. Because contraction of the volume occurs so that the density of the upper electrode is lowered, reduction gas permeates the ruthenium film of the upper electrode to reduce the tantalum oxide film and hydrogen is contained in the tantalum oxide film. As a result, there occur such problems that leak current increases.

SUMMARY OF THE INVENTION

A prominent object of the present invention is to provide a method for manufacturing a novel MIM type capacitor in which leak current of a capacitor is not increased due to oxidation of ruthenium film of the upper electrode.

An aspect of the present invention is a manufacturing method of a semiconductor device comprising a memory selection MISFET formed on a main surface of a semiconductor substrate and a capacitor having a lower electrode electrically connected to one of source and drain of the memory cell selection MISFET, an upper electrode and a capacity insulation film provided between the lower electrode and the upper electrode, the method comprising the steps of: forming the capacity insulation film; forming the upper electrode film on the capacity insulation film; forming an upper electrode protective film so as to be contact with the upper electrode film; and etching the upper electrode protective film and the upper electrode film into a shape of the upper electrode.

The effects, which can be obtained by the present invention, will be described simply as follows.

(1) According to the present invention, the ruthenium film of the upper electrode can be etched without damaging (oxidation, formation of cavity) the ruthenium film of the upper electrode.

(2) According to the present invention, increase in leak current of the capacitor due to treatment with hydrogen is suppressed.

(3) According to the present invention, the reliability of the MIM type capacitor is improved.

(4) According to the present invention, the reliability of a device (DRAM or the like) having the MIM type capacitor is improved.

BRIEF DESCRIPTION OF THE DRAWINGS

FIG. 21 shows influences of material of upper electrode protective film and its formation method upon capacitor characteristic;

DESCRIPTION OF THE PREFERRED EMBODIMENTS

The preferred embodiment of the present invention will be described with reference to the accompanying drawings in order to clarify the above-described and other objects, features and advantage of the present invention.

(First Embodiment)

(1) Manufacturing Method

The manufacturing method of the MIM capacitor according to an embodiment of the present invention will be described with reference to FIGS. 15–21.

Figure 5:
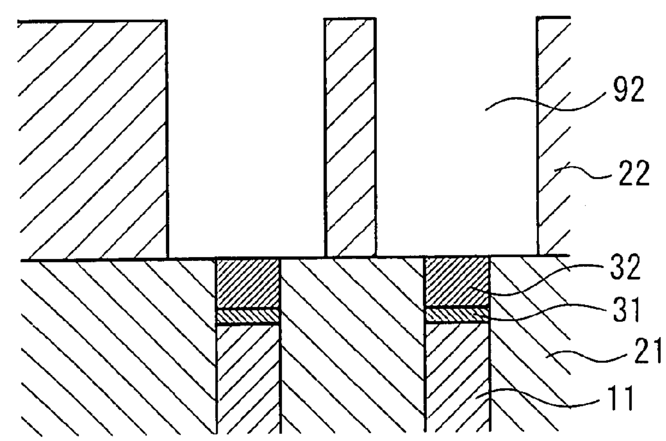
FIG. 5 is a sectional view showing the manufacturing step of a capacitor according to the first conventional method.
Figure 6:
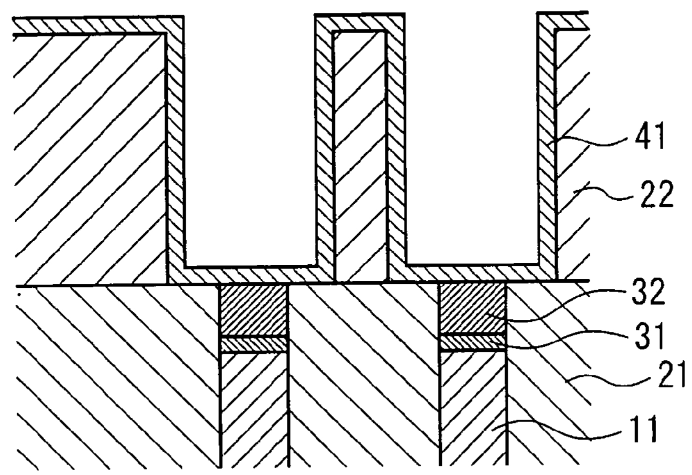
FIG. 6 is a sectional view showing the manufacturing step of a capacitor according to the first conventional method.
Figure 7:
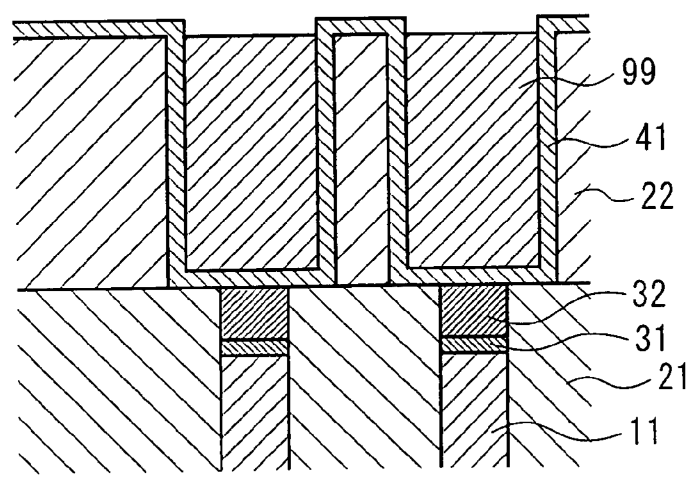
FIG. 7 is a sectional view showing the manufacturing step of a capacitor according to the first conventional method.
Figure 8:
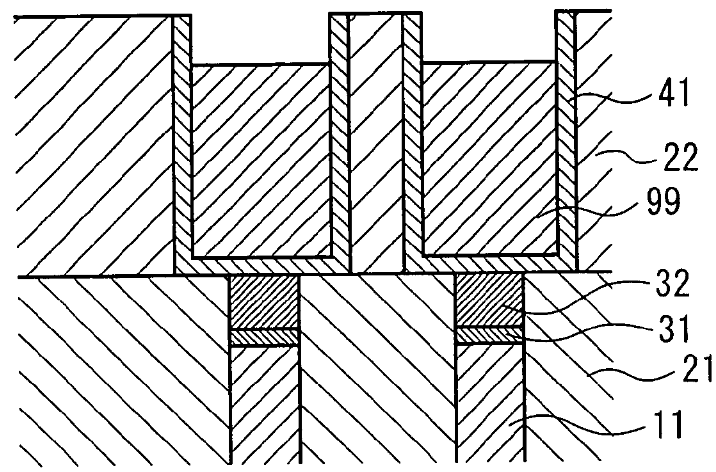
FIG. 8 is a sectional view showing the manufacturing step of a capacitor according to the first conventional method.
Figure 9:
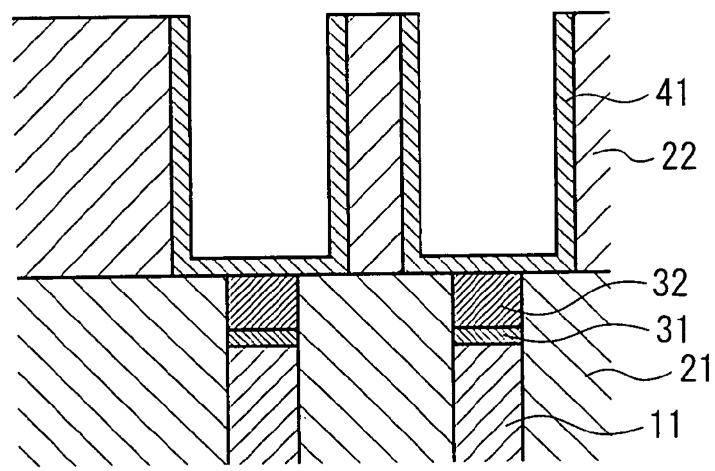
FIG. 9 is a sectional view showing the manufacturing step of a capacitor according to the first conventional method.

First, an interlayer insulation film 21, a polysilicone plug 11, a barrier metal film 32, an interlayer insulation film 22, a cylinder hole 92 and the like were formed successively (see FIG. 5). After that, a ruthenium film 41 having a thickness of 20 nm was formed as a lower electrode according to spattering method and CVD method (see FIG. 6). Here, the ruthenium film was formed using the CVD method with a ruthenium film formed according to PCM spattering method as a seed layer (see FIG. 7). If the PCM spattering method is employed, grain boundary density of ruthenium film formed on the bottom of the lower electrode 41 is small so that diffusion of oxygen through the lower electrode is suppressed. As a consequence, there occurs no problem that the barrier metal film is oxidized in subsequent heat treatment process for the capacity insulation film. The formation of the ruthenium film based on the CVD method is carried out under a film forming temperature of 320° C. and total pressure of 400 Pa using ethyl cyclo penta dienyl ruthenium ($Ru(C_2H_5C_5H_4)_2$) and oxygen as material gas. Next, a photo resist film is formed in a hole and then, the ruthenium film at the top of the hole is etched back while protecting the ruthenium film in the hole (see FIG. 8). Next by removing the photo resist film, a cup-like lower electrode 41 was obtained (see FIG. 9). After that, the ruthenium film 41 was heat-treated in the atmosphere of hydrogen (20% diluted by nitrogen). The purpose of this heat treatment is to make dense the ruthenium film and to improve its orientation property thereof beforehand not to contract or deform during subsequent heat treatment leading to an increase in leak current. The reason why the heat treatment is carried out in the atmosphere of hydrogen is to accelerate separation of ruthenium oxide and impurity contained in the ruthenium film to improve the denseness and orientation property.

Figure 10:
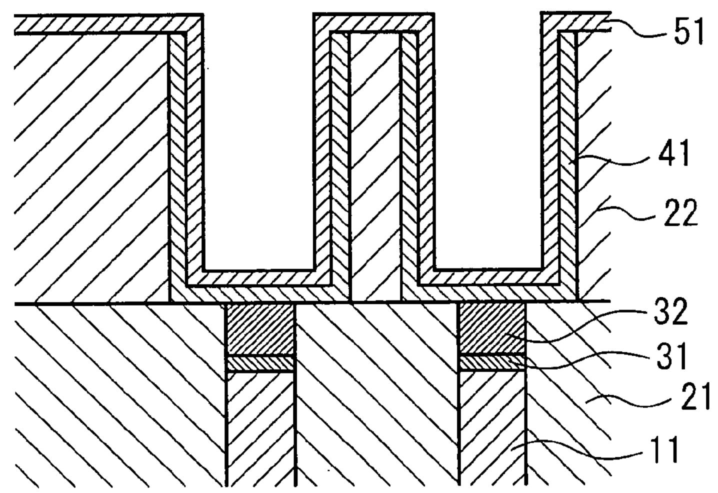
FIG. 10 is a sectional view showing the manufacturing step of a capacitor according to the first conventional method.

Next, tantalum oxide film 51 having a thickness of 15 nm was formed according to the CVD method and heat treatment was carried out to reform the tantalum oxide film 51 (see FIG. 10). This heat treatment was carried out in the atmosphere of ozone under a temperature of 410° C. for 10 minutes. The reason why the heat treatment is carried out in the atmosphere of ozone is that ozone is stronger in oxidative power than other oxidizing gas such as oxygen and nitric oxide and capable of reforming the tantalum oxide film sufficiently. The heat treatment temperature is preferred to be in a range of 360° C. or more to less than 460° C. The reason is that the tantalum oxide film is not reformed sufficiently at temperatures lower than 360° C. and the leak current increases, and on the other hand, the ruthenium film of the lower electrode is oxidized at temperatures higher than 460° C. and also the leak current increases.

Figure 15:
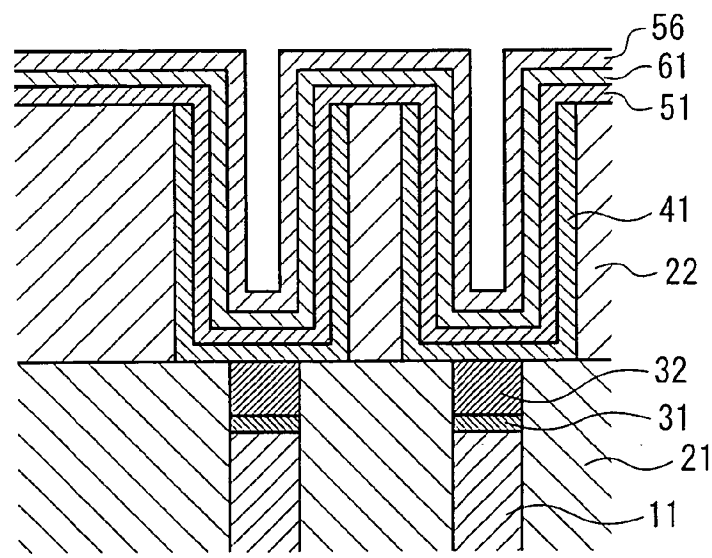
FIG. 15 is a sectional view showing the manufacturing step of the capacitor according to the first embodiment of the present invention.

Next, after the ruthenium film 61 was formed as the upper electrode according to the spattering method and CVD method, a second tantalum oxide film 56 was formed as an upper electrode protecting film according to the CVD method (see FIG. 15).

Figure 16:
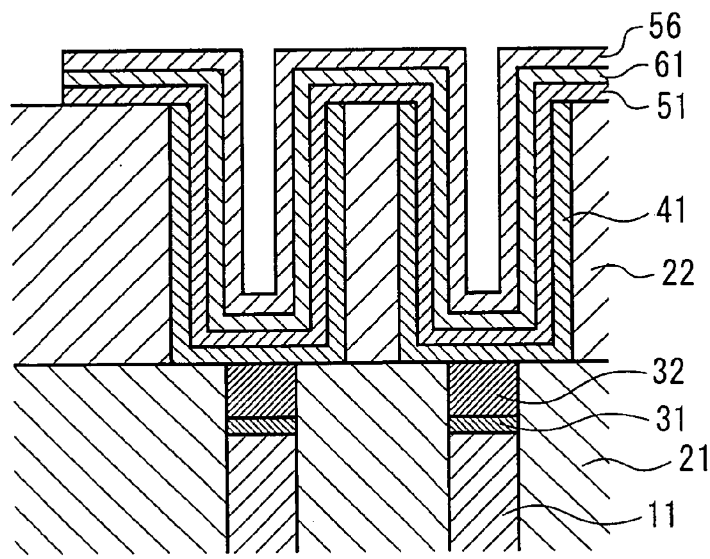
FIG. 16 is a sectional view showing the manufacturing step of the capacitor according to the first embodiment of the present invention.
Figure 17:
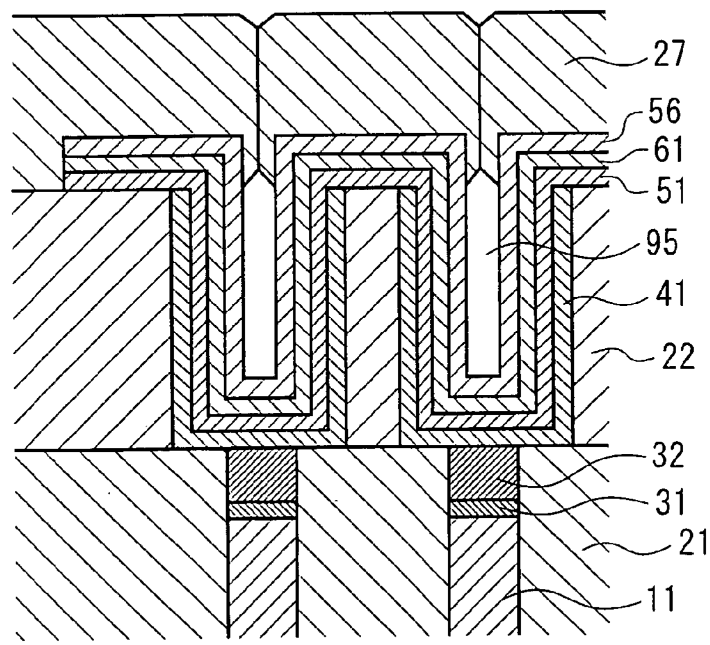
FIG. 17 is a sectional view showing the manufacturing step of the capacitor according to the first embodiment of the present invention.
Figure 18:
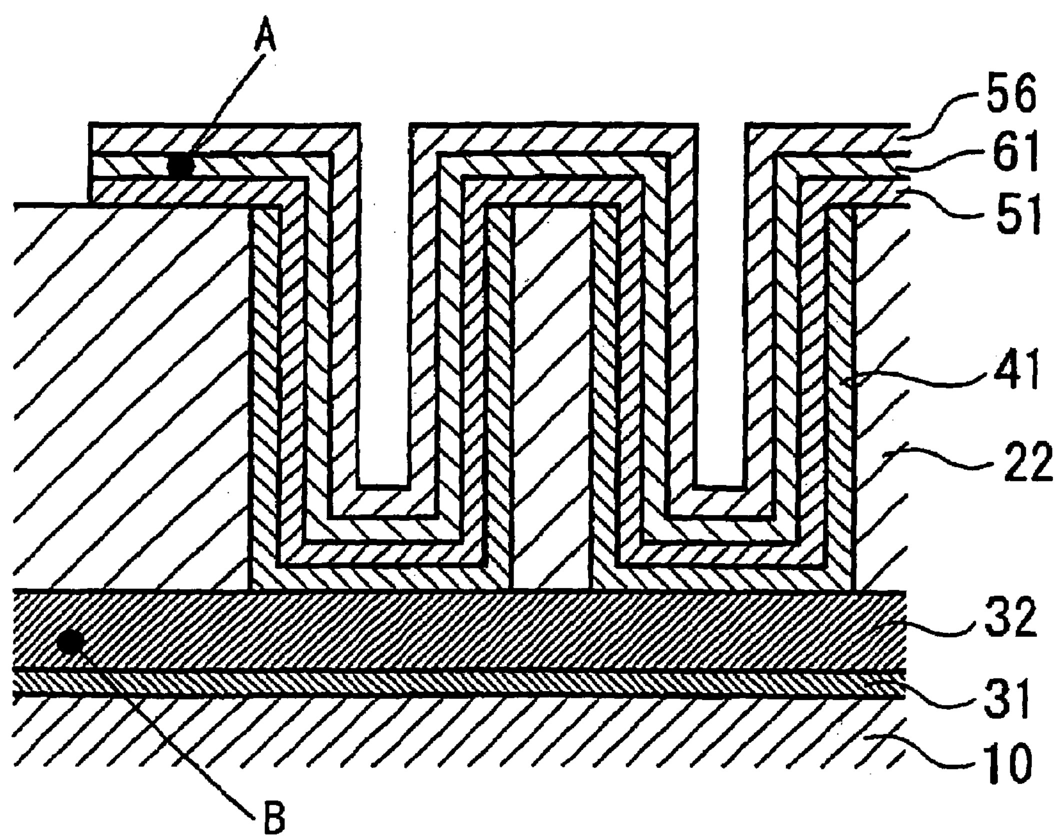
FIG. 18 is a sectional view of a capacitor used for I-V characteristic evaluation according to the first embodiment of the present invention.

The second tantalum oxide film 56 and ruthenium film 61 were processed into the shape of the upper electrode according to photolithography technology and dry etching technology (FIG. 16). There are two methods for processing the second tantalum oxide film 56 and the ruthenium film 61. That is, the two methods are (1) a method in which the second tantalum oxide film 56 and the ruthenium film 61 are etched all at once with the photo resist film as a mask and (2) a method in which after the second tantalum oxide film 56 is etched using the photo resist film as a mask and the photo resist film is removed according to ashing method or the like, the ruthenium film is etched with the second tantalum oxide film 56 as a mask. The method (1) has such a disadvantage that the accuracy of fine pattern processing is low although its etching process is simple. On the other hand, the method (2) is excellent in the accuracy of the fine pattern processing although its etching process is complicated. An appropriate process needs to be selected taking into account a necessary pattern processing accuracy and process cost. Further the method (2) obtains a high processing superiority because the ruthenium film 61 is substantially not etched if chlorine ($Cl_2$) and boron trichloride ($BCl_3$) are used as etching gas when the tantalum oxide film 56 is etched. Additionally, if oxygen and chlorine ($Cl_2$) are used as etching gas when the ruthenium film 61 is etched, it obtains a high processing superiority also because the tantalum oxide film 56 is substantially not etched.

Figure 1:
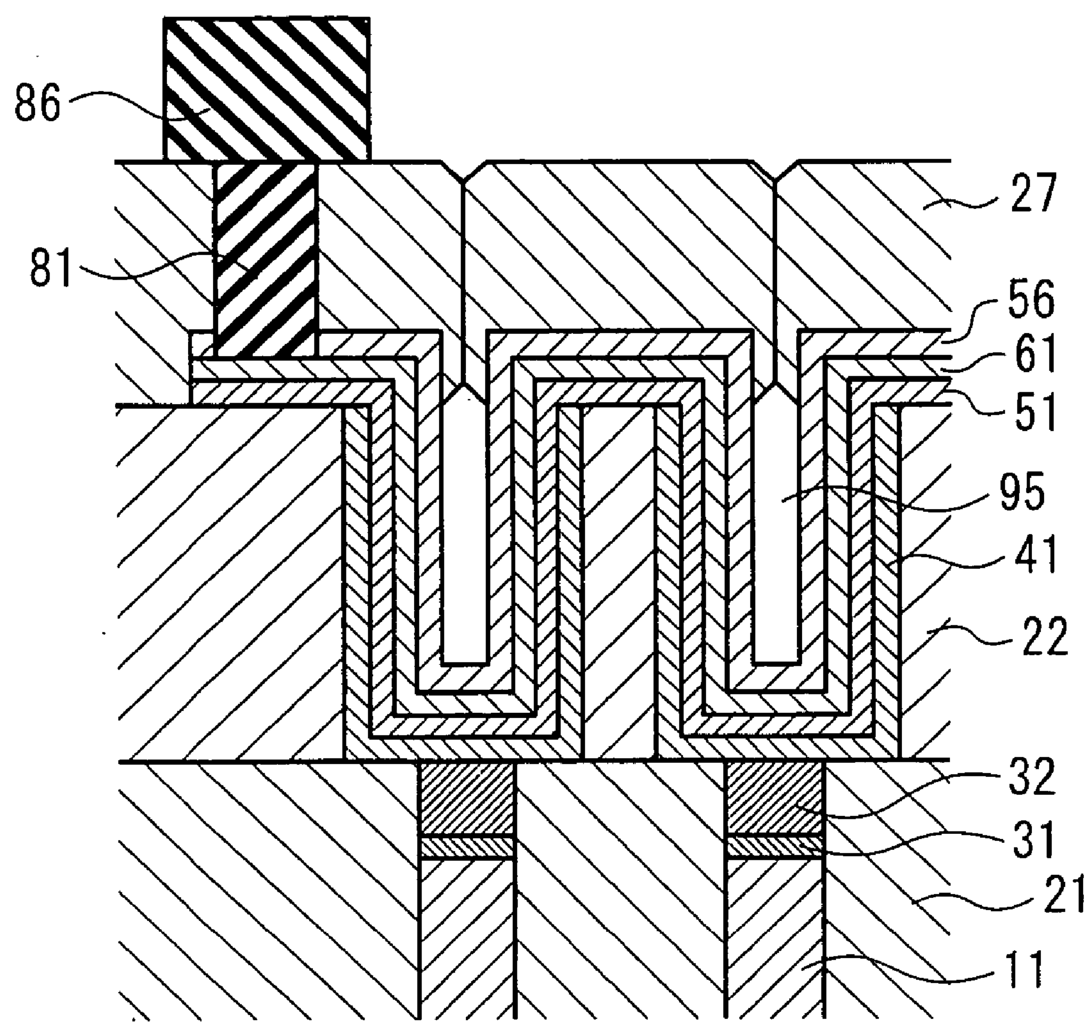
FIG. 1 is a sectional view showing the capacitor according to a first embodiment of the present invention.
Figure 2:
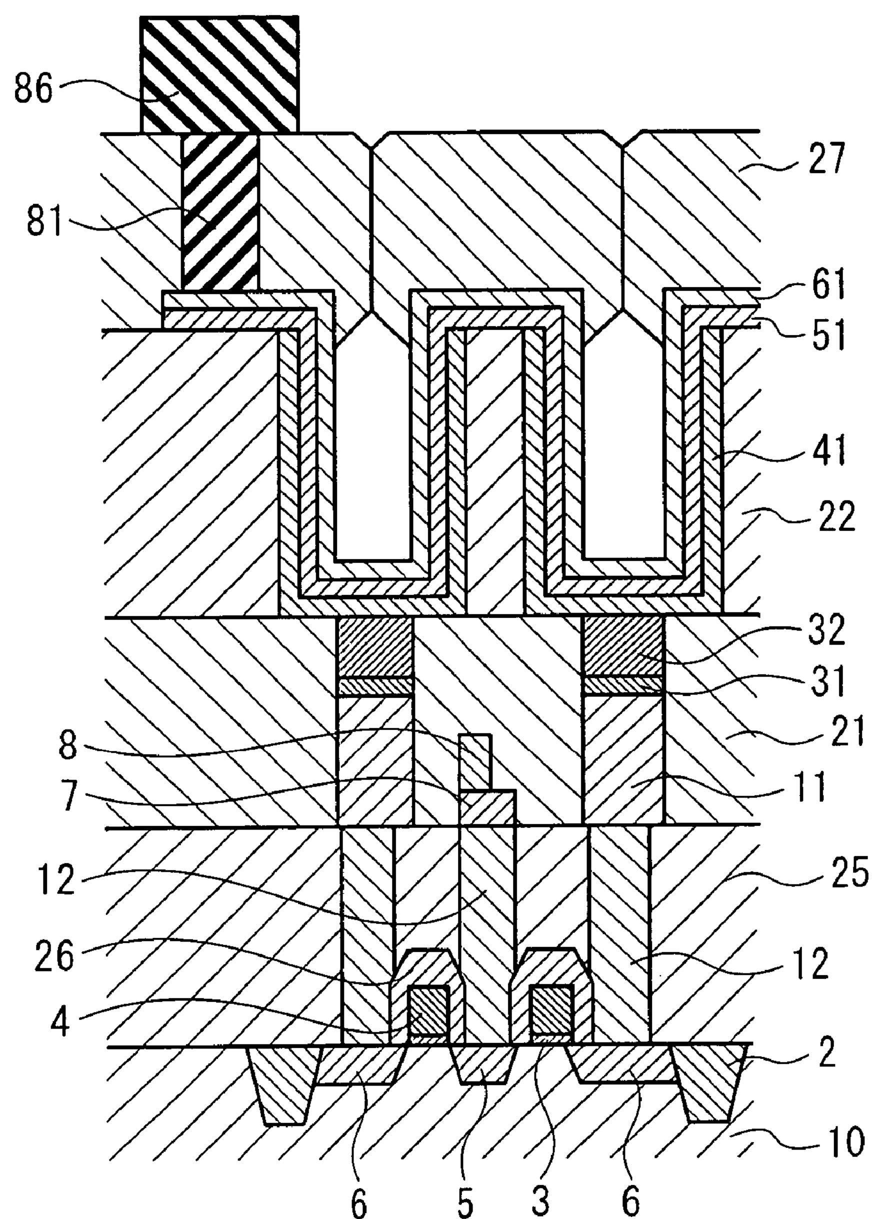
FIG. 2 is a sectional view showing the first conventional memory cell having a MIM type capacitor.
Figure 3:
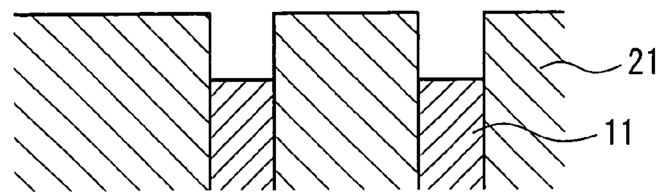
FIG. 3 is a sectional view showing the manufacturing step of a capacitor according to the first conventional method.

After that, the interlayer insulation film 27 is formed (FIG. 17) and by filling an open connection hole with a connection plug 81, a first layer wiring 86 is formed (FIG. 1).

Although titan nitride film is used as the barrier metal film according to this embodiment, it is permissible to use tantalum nitride film, tungsten nitride film, tungsten nitride silicide film, tantalum nitride silicide film, titan nitride silicide film, titan nitride aluminum film or the like. Further, it is permissible to use platinum or iridium instead of ruthenium film as the lower electrode and upper electrode. Further it is permissible to use aluminum oxide film, strontium titanate (STO) film, barium strontium titanate (BST) film, hafnium oxide film, hafnium silicide oxide film or the like as a capacity insulation film instead of tantalum oxide film. It is permissible to use a plurality of above-mentioned films, which are laminated.

(2) Characteristic Evaluation/analysis Result (2-1) Capacitor Characteristic

The characteristic evaluation result and analysis result of the capacitor will be described in detail. The experimental condition described below is based on the manufacturing method of the above-described capacitor except its special notes.

First, the I-V characteristic of the capacitor was investigated. Here, a parallel array TEG of 274 kbit of a capacitor having the sectional structure shown in FIG. 18 was used. With the potential (B) of the barrier metal film fixed and a voltage is applied to the upper electrode (A), current flowing between the barrier metal film and the upper electrode was measured.

Figure 12:
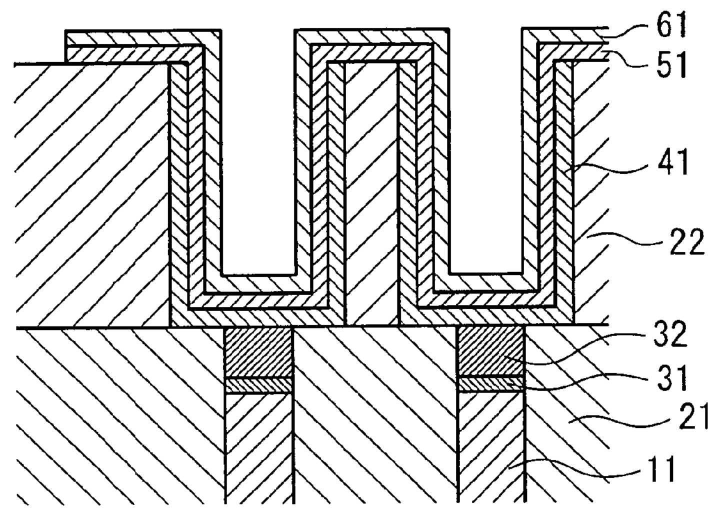
FIG. 12 is a sectional view showing the manufacturing step of a capacitor according to the first conventional method.
Figure 19:
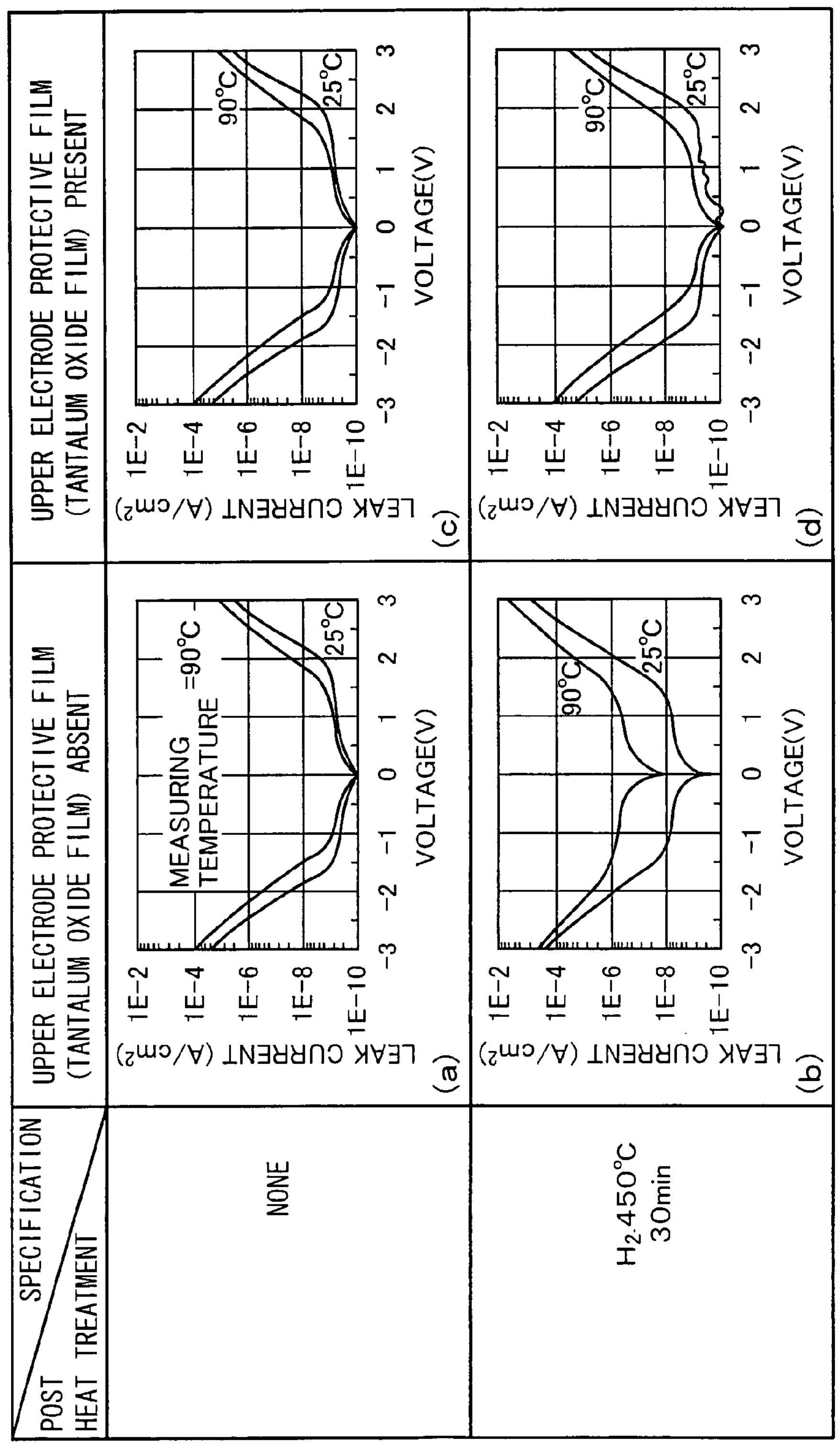
FIG. 19 shows an evaluation result of the I-V characteristic according to the first embodiment of the present invention.

FIG. 19 shows the evaluation result of the I-V characteristic. If no upper electrode protective film (tantalum oxide film) was provided (corresponding to FIG. 12 of the conventional technology), the leak current increases after treatment with hydrogen (at 450° C. for 30 minutes) although the leak current before treatment with hydrogen was less than 1 e-9 A/cm$^2$ (at ±1V, practical range is less than 1 e-8 A/cm$^2$). Particularly if a measuring temperature is 90 (C (corresponding to the operating temperature of DRAM), the leak current increases to 5 e-7 A/cm$^2$ (FIG. 19(*a*), (*b*)). On the other hand, if an upper electrode protective film is provided (FIG. 18), the leak current remains less than 1 e-9 A/cm$^2$ after treatment with hydrogen (FIGS. 19(*c*), (*d*)) so that the leak current can be suppressed sufficiently.

Figure 13:
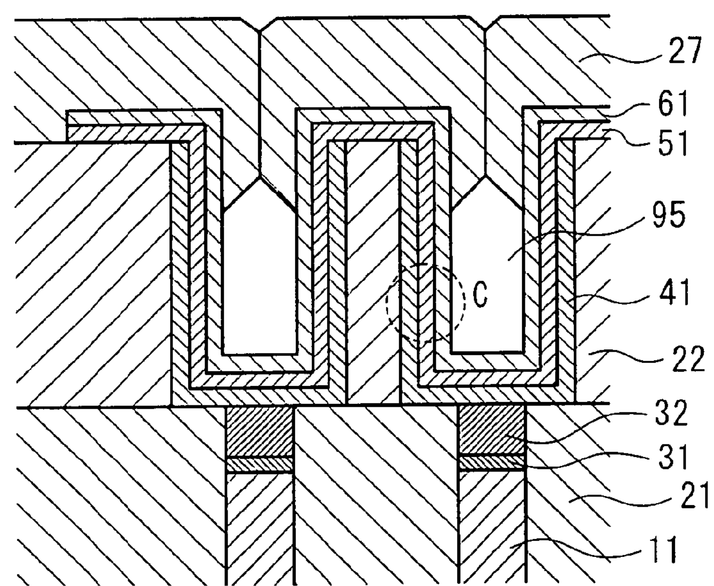
FIG. 13 is a sectional view showing the manufacturing step of a capacitor according to the first conventional method.
Figure 14:
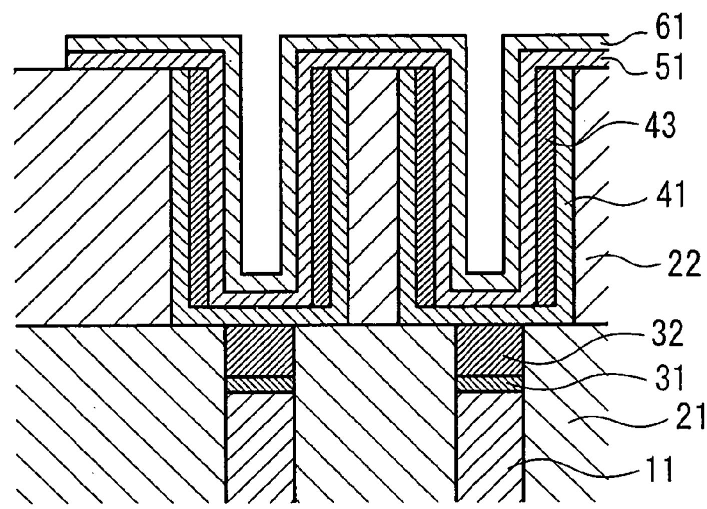
FIG. 14 is a sectional view showing the second conventional MIM type capacitor.
Figure 20:
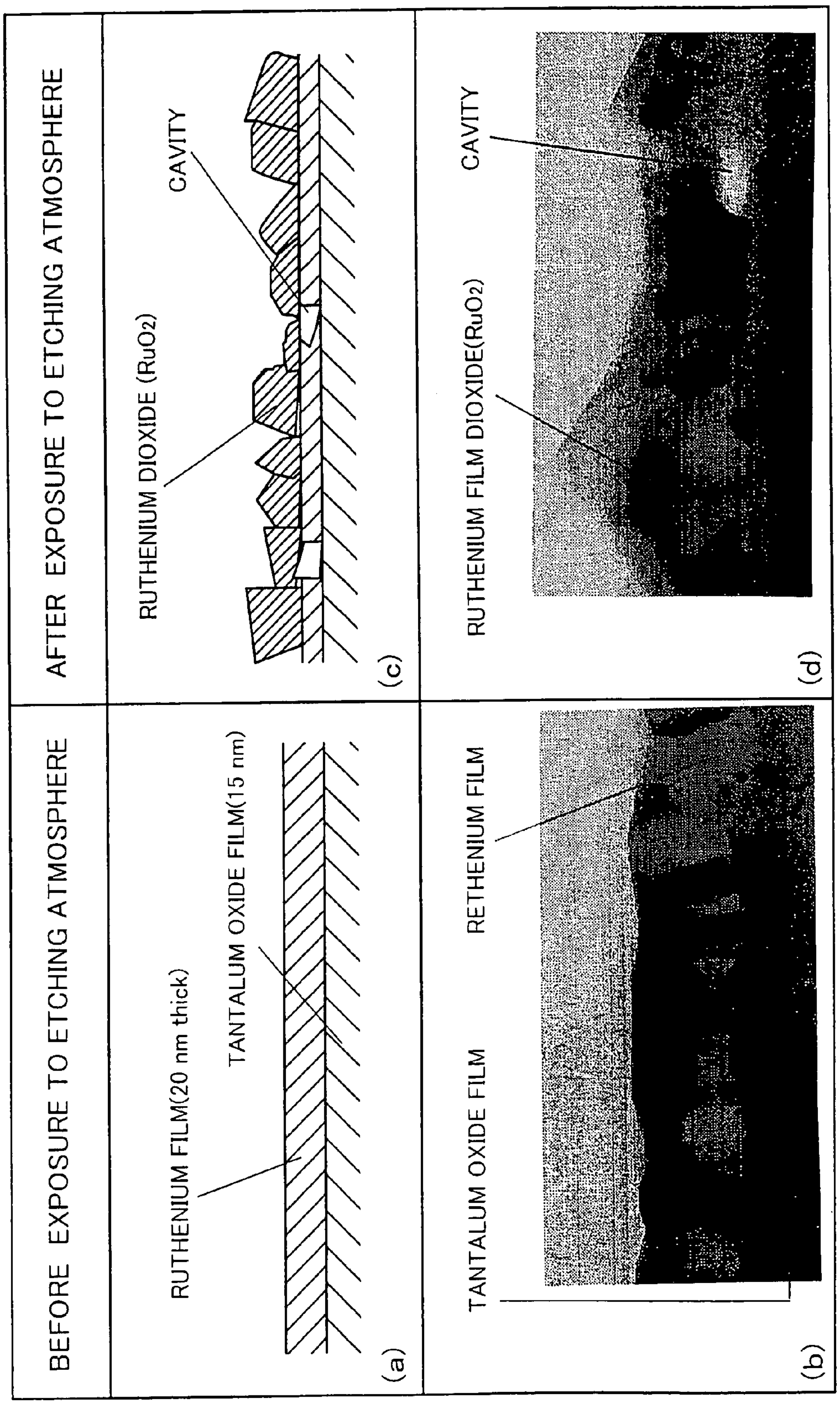
FIG. 20 shows a sectional structure of a specimen for analysis according to the first embodiment of the present invention.

(2—2) Result of Section TEM Analysis and Consideration on Leak Current Increase Mechanism The section TEM (Transmission Electric Microscope) analysis was carried out in order to clarify the mechanism of leak current increase by treatment with hydrogen based on the conventional technology (in case where no upper electrode protective film is present). An analysis specimen having the structure shown in FIGS. 20(*a*), (*b*) was produced by imitating the portion C in FIG. 13. FIGS. 20(*c*), (*d*) show a condition after the same specimen is exposed to the etching environment similar to the upper electrode processing. Here, the etching atmosphere is composed of following two steps.

First Step atmosphere: mixture gas of chlorine ($Cl_2$) and oxygen ($O_2$)

temperature: 50° C.

Pressure: 1.5 Pa

Main purpose: etching of ruthenium (Ru) film

Second Step atmosphere: mixture gas of carbon tetrachloride ($CF_4$) and oxygen ($O_2$)

temperature: 150° C.

pressure: 100 Pa main purpose: removal of resist film (ashing)

After an exposure to etching atmosphere, it was made evident that a foreign kind of layer and cavity were formed. As a result of electronic beam diffraction analysis, it was made evident that this foreign kind of layer was ruthenium dioxide ($RuO_2$). The ruthenium film is oxidized easily and turns to ruthenium tetroxide ($RuO_4$) and vaporizes. It is considered that a cavity was formed in the ruthenium film at this time. Further, it is considered that vaporized ruthenium tetraoxide ($RuO_4$) adhered to the ruthenium film again and decomposed (disproportioned) so as to form ruthenium dioxide film ($RuO_2$).

It is considered that because hydrogen arrives at the capacity insulation film (tantalum oxide film) easily at the time of subsequent treatment with hydrogen through a formed cavity and oxygen loss is formed in the capacity insulation film, containing hydrogen, the leak current increases. Further, the ruthenium dioxide layer ($RuO_2$) reacts with hydrogen so that it is reduced to ruthenium (Ru) again. It is considered that formation of the cavity or generation of stress change results in increase of the leak current.

On the other hand, if the upper electrode protective film is formed, no ruthenium tetraoxide ($RuO_4$) or cavity is formed because the ruthenium film is not exposed to etching atmosphere. For the reason, there is no increase in leak current due to treatment with hydrogen.

(2–3) Relation Between Material, Formation Method of Upper Electrode Protective Film and Capacitor Characteristic A relation between material, formation method of an upper electrode protective film and capacitor characteristic was investigated and the result is shown in FIG. 21.

If formation of the upper electrode protective film is executed in the reduction atmosphere, a large leak current flows regardless of before and after treatment with hydrogen (>1 e-8 A/cm$^2$). It is considered that because when the upper electrode protective film was formed, oxygen loss was formed in the capacity insulation film (tantalum oxide film) and hydrogen was contained, leak current increased. Further when plasma processing is accompanied when the upper electrode protective film is formed, the leak current is large regardless of before and after treatment with hydrogen. This is considered to be because the capacity insulation film was damaged accompanied by the plasma treatment. When oxygen ($O_2$) was used as material CVD gas in case where aluminum oxide film is employed as the upper electrode protective film, the leak current increases. This is considered to be because the tantalum oxide film of the capacity insulation film was partly crystallized as the film formation temperature was as high as 600° C. When ozone ($O_3$) was used as the material CVD gas, leak current increased after treatment with hydrogen. As a result of analysis, it was made evident that ruthenium dioxide ($RuO_2$) was formed on an interface between the ruthenium (Ru) film of the upper electrode and aluminum oxide film. It is considered that the leak current increased because the ruthenium (Ru) film was oxidized by ozone so that ruthenium dioxide ($RuO_2$) was formed and then, this ruthenium dioxide ($RuO_2$) layer was contracted at the time of treatment with hydrogen.

As described above, a film which can be formed under temperatures of equal to or lower than 500° C. without accompanying plasma treatment not under reduction atmosphere is suitable for the upper electrode protective film. As a formation method of the upper electrode protective film, a method that does not use ozone as the CVD gas is suitable. The tantalum oxide film is the most suitable for the upper electrode protective film followed by the aluminum oxide film using ozone as the CVD gas.

In the meantime, the aluminum oxide film can be formed by using trimethyl aluminum ($Al(CH_3)_3$) and oxygen as material gas or by using trimethyl aluminum ($Al(CH_3)_3$) and ozone as material gas.

(2–4) Relation Between Formation Method of Tantalum Oxide Film and Capacitor Characteristic Usually, formation of the tantalum oxide film is carried out using pentaethoxy tantalum ($Ta(OC_2H_5)_5$) and oxygen as material gas at a temperature of about 440° C. The reason why the film formation is carried out at this temperature is that the coverage is worse if the temperature is higher than this. On the other hand, if the temperature is lower than this, film formation velocity is low leading to lowering of productivity and foreign matter such as hydrogen and carbon is likely to be contained in the film so that the leak current increases.

If tantalum oxide film is formed on ruthenium film, depending on the case, the film formation temperature rises abnormally and rapidly because of catalytic action of ruthenium film at the initial period of the film formation, so that abnormal phenomenon such as oxidation of ruthenium film and formation of the tantalum oxide film with a poor coverage occurs. A following measure is effective for preventing this abnormal phenomenon from occurring.

Carrying out the film formation by two steps of a first step of forming its initial period layer at a low growth velocity at temperatures lower than 440° C. at the initial period of the formation and a second step of film formation at a high growth velocity at a temperature of about 440° C. is effective for suppressing any abnormal phenomenon and securing productivity. The reason is that under low temperatures, abnormal phenomenon such as oxidation of ruthenium film and coverage deterioration of tantalum oxide film is unlikely to occur. Further, a further reason is that once the surface of ruthenium film is covered with tantalum oxide film, any abnormal phenomenon originating from catalytic action of the ruthenium film does not occur even if the film formation is carried out at a temperature of 440 (C.

The first film formation step is preferred to be carried out under temperatures of 350–400° C. from viewpoints of productivity and foreign matter in the film. The thickness of the initial period layer is sufficient if it is 0.1 nm –2 nm. Further as another formation method, a method of introducing only pentaethoxy tantalum ($Ta(OC_2H_5)_5$) into a film forming apparatus at the initial film formation period or reducing the flow rate of oxygen is effective also. In these cases, the initial period layer can be formed without inducing abnormal phenomenon.

Further, reducing the flow rate of oxygen in the first film formation step to be smaller than the flow rate of oxygen in the second film formation step is desirable for the film formation.

(Second Embodiment)

The manufacturing method of the MIM capacitor according to the present invention will be described with reference to FIGS. 22–26.

This embodiment concerns a structure in which another low resistance layer is placed on the ruthenium film of the upper electrode. If such an upper electrode structure is used for the DRAM, its operation speed can be improved as described in Japanese Unexamined Patent Publication (KOKAI) No.2001-144266. As this low resistance film, tungsten film formed by spattering is suitable. The tungsten film is a low resistance film having a resistance of about 10 82 Ω·cm. The reason why the spattering method is employed instead of the CVD method is that the CVD method increases leak current of the capacitor because of hydrogen ($H_2$) of material gas. At the time of processing of the ruthenium film of the upper electrode, the tungsten film can be used as a hard mask. This embodiment shows an example in which the upper electrode has a laminated structure composed of ruthenium film and tungsten film and tantalum oxide film is used as the upper electrode protective film.

(1) Manufacturing Method

Figure 11:
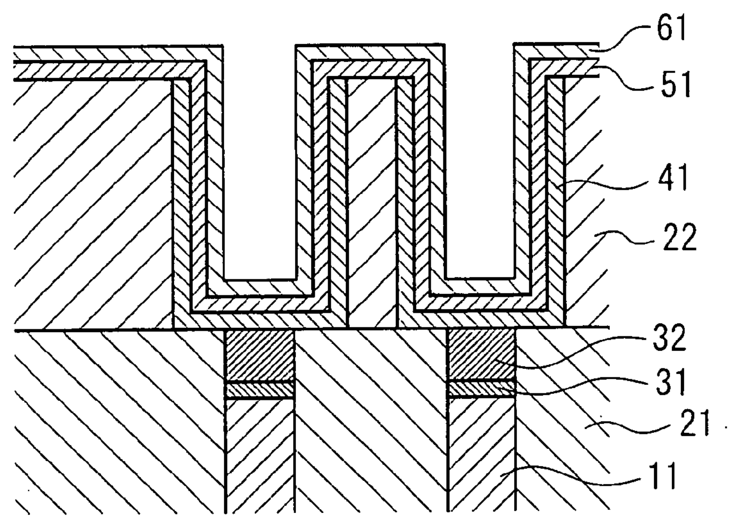
FIG. 11 is a sectional view showing the manufacturing step of a capacitor according to the first conventional method.
Figure 22:
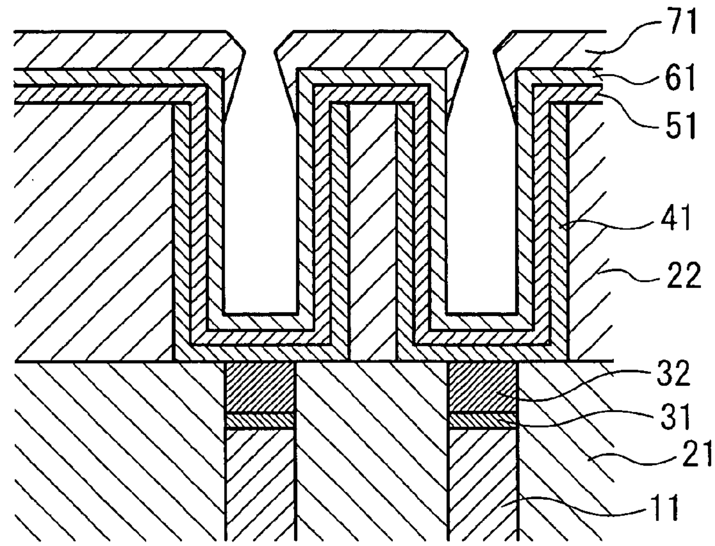
FIG. 22 is a sectional view showing the manufacturing step of the capacitor according to the second embodiment of the present invention.
Figure 23:
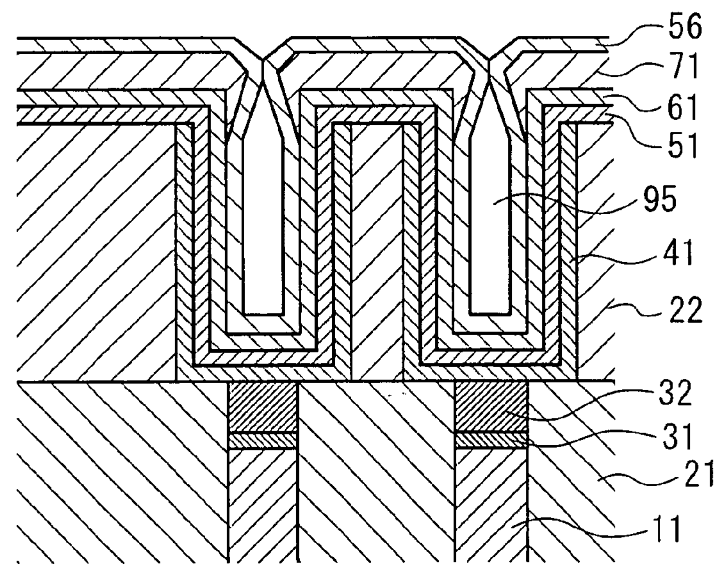
FIG. 23 is a sectional view showing the manufacturing step of the capacitor according to the second embodiment of the present invention.

According to the same method as the conventional one, an interlayer insulation film 21, a polysilicone plug 11, a barrier metal film 32, an interlayer insulation film 22, a cylinder hole 92, a lower electrode (ruthenium film) 41, a capacity insulation film (tantalum oxide film) 51, an upper electrode ruthenium film 61 and the like are formed successively (see FIG. 11). A tungsten film 71 is formed thereon according to spattering method (FIG. 22). Although the tungsten film is formed on the top portion of the capacitor because its coverage is poor due to the formation method, a cavity 95 is formed inside the capacitor. A second tantalum oxide 56 is formed thereon as the upper electrode protective film according to the CVD method (FIG. 23).

Figure 24:
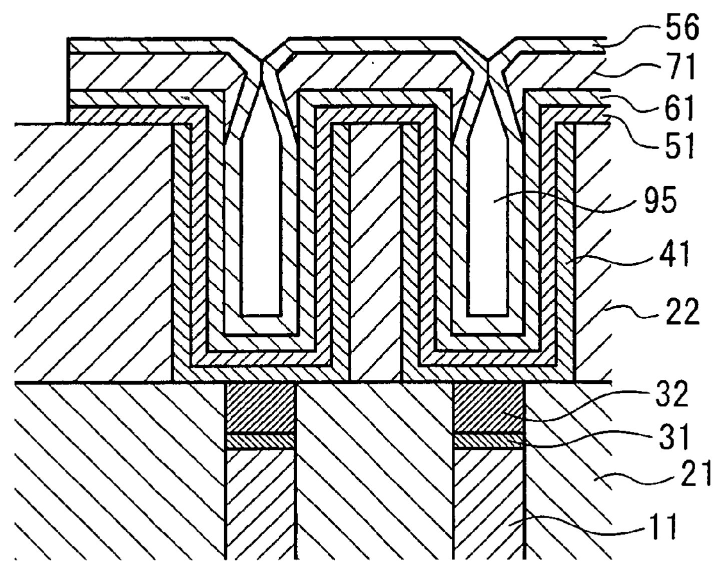
FIG. 24 is a sectional view showing the manufacturing step of the capacitor according to the second embodiment of the present invention.
Figure 25:
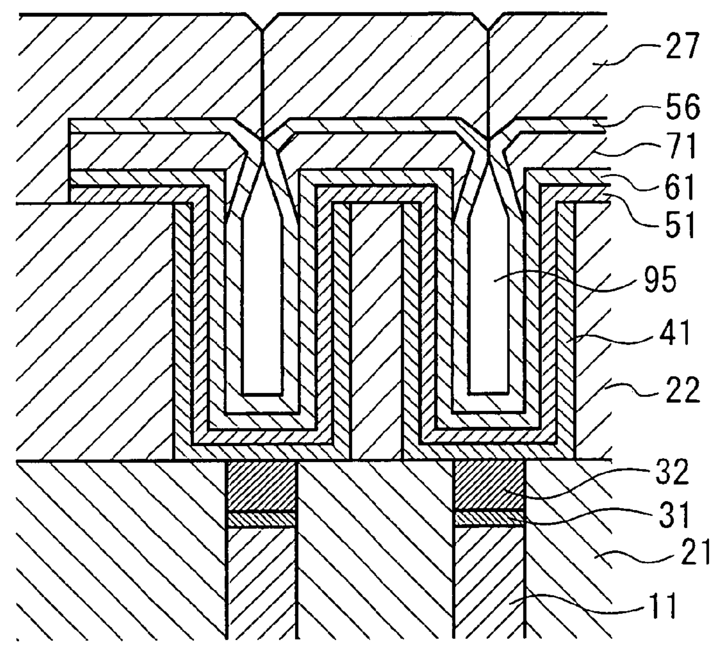
FIG. 25 is a sectional view showing the manufacturing step of the capacitor according to the second embodiment of the present invention.

Subsequently, the second tantalum oxide film 56, the tungsten film 71 and the ruthenium film 61 were processed to the shape of the upper electrode according to photolithography technology and dry etching technology (FIG. 24). Here, (1) with the photo resist film as a mask, the second tantalum oxide film 56, the tungsten film 71 and the ruthenium film 61 may be etched all at once. (2) It is permissible to etch the second tantalum oxide film 56 with the photo resist film as a mask so as to remove the photo resist film by ashing method or the like and then etch the tungsten film 71 and the ruthenium film 61 with the second tantalum film 56 as a mask. Alternatively, (3) it is permissible to etch the second tantalum oxide film 56 and the tungsten film 71 with the photo resist film as a mask so as to remove the photo resist film according to ashing method or the like and then, etch the ruthenium film 61 with the second tantalum film 56 and the tungsten film 71 as a mask. A process needs to be selected by taking into account a necessary pattern processing accuracy and process cost.

Figure 26:
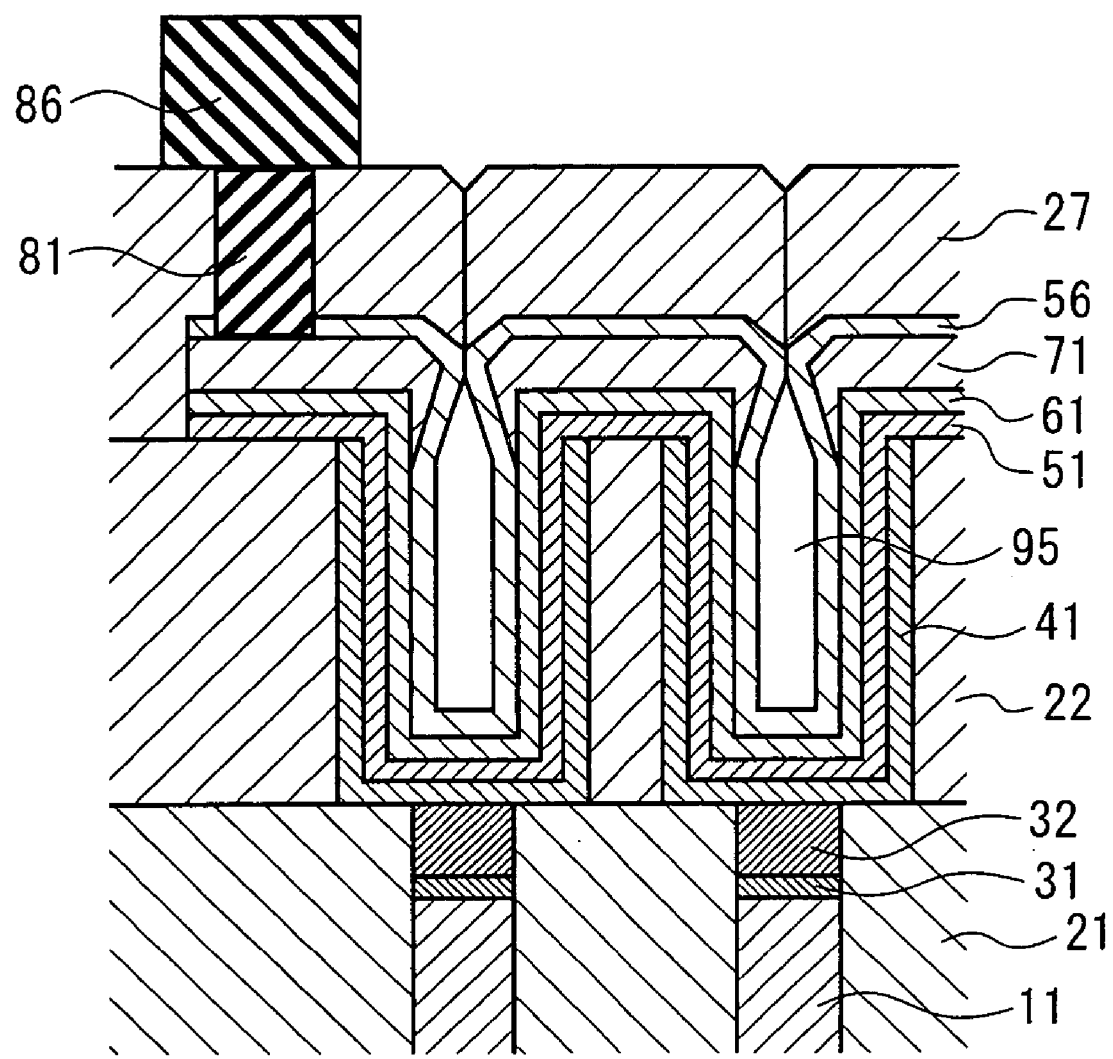
FIG. 26 is a sectional view showing the manufacturing step of the capacitor according to the second embodiment of the present invention.

After that, the interlayer insulation film 27 was formed (FIG. 25), a connection plug 81 was embedded into a connection hole made in the interlayer insulation film 27 and the first layer wiring 86 was formed and consequently, a capacitor having the structure shown in FIG. 26 was obtained.

(2) Characteristic Evaluation and Result of Analysis

Figure 27:
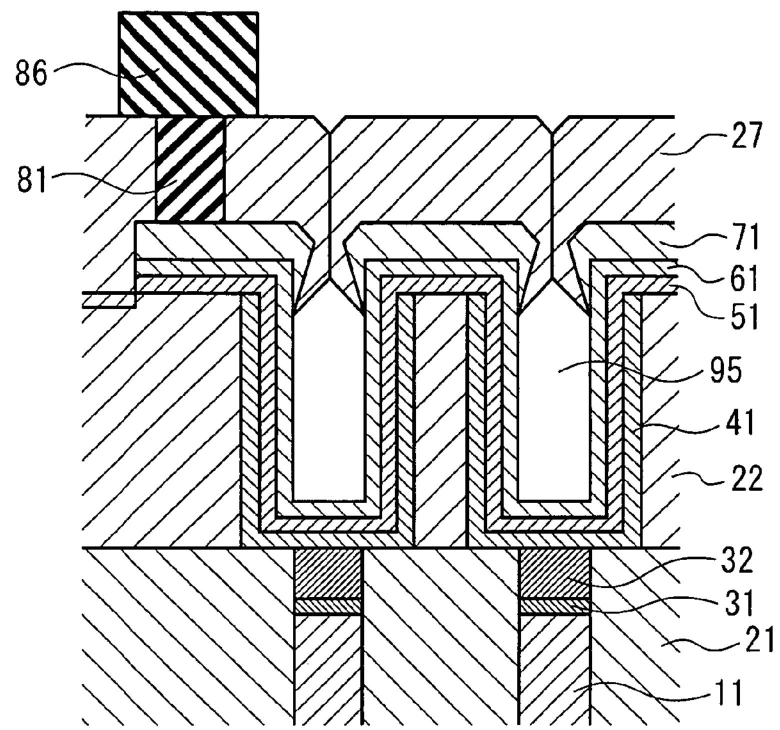
FIG. 27 is a sectional view showing the third conventional MIM type capacitor.

The I-V characteristic of the capacitor was investigated. Like the first embodiment, a difference in leak current depending on whether or not the upper electrode protective film (tantalum oxide film) was present was recognized. That is, although in the conventional example having no upper electrode protective film (FIG. 27), the leak current before treatment with hydrogen was less than 1 e-9 A/$cm^2$ (under ±1V), the leak current after treatment with hydrogen (at 450° C. for 30 minutes) increased up to 5 e-7 A/$cm^2$.

Not only if the upper electrode is composed of ruthenium film only but also if other film is formed on the ruthenium film according to spattering method as indicated in this example, the ruthenium film of the upper electrode has an effect of preventing alteration of the ruthenium film due to etching processing and an increase in the leak current originating from that alteration.

(Third Embodiment)

The manufacturing method of the MIM capacitor according to the present invention will be described with reference to FIGS. 28–37. This embodiment is an example of application to a capacitor having a bottom electrode structure different from the first embodiment, that is, pedestal (column-like) structure bottom electrode.

(1) Manufacturing Method

Figure 4:
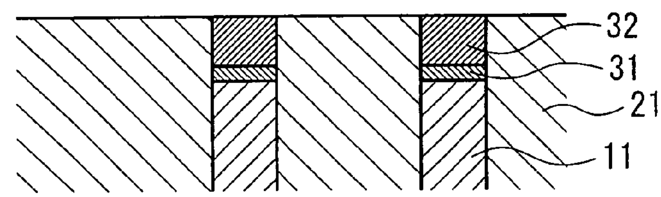
FIG. 4 is a sectional view showing the manufacturing step of a capacitor according to the first conventional method.
Figure 28:
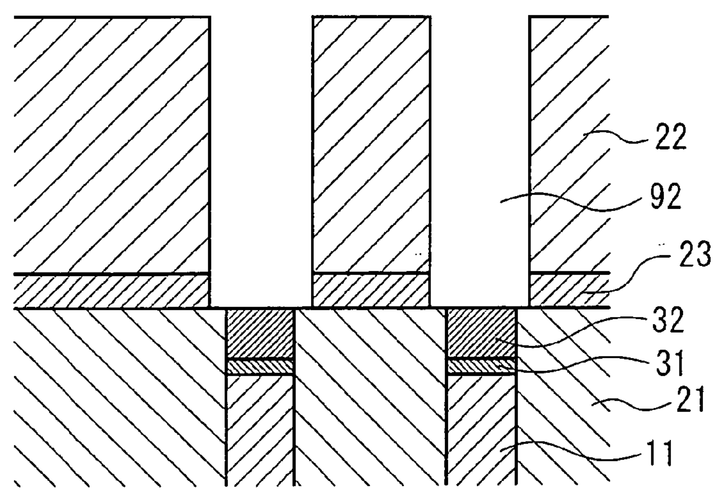
FIG. 28 is a sectional view showing the manufacturing step of the capacitor according to the third embodiment of the present invention.
Figure 29:
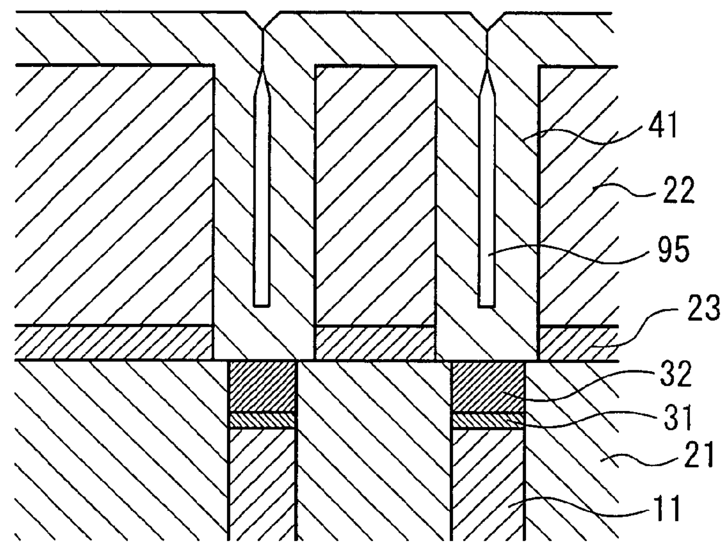
FIG. 29 is a sectional view showing the manufacturing step of the capacitor according to the third embodiment of the present invention.
Figure 30:
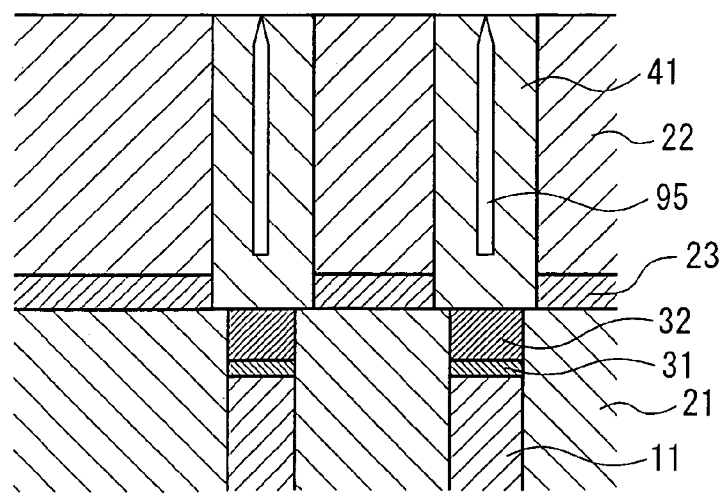
FIG. 30 is a sectional view showing the manufacturing step of the capacitor according to the third embodiment of the present invention.
Figure 31:
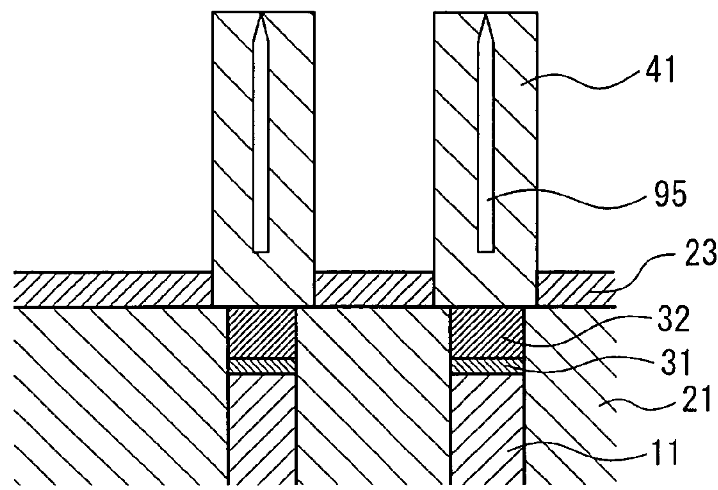
FIG. 31 is a sectional view showing the manufacturing step of the capacitor according to the third embodiment of the present invention.

First, the interlayer insulation film 21, the polysilicone plug 11 and the barrier metal film 32 were formed successively in the same method as the conventional one (see FIG. 4). Next, the interlayer insulation film 23 and the interlayer insulation film 22 were formed successively and the cylinder hole 92 penetrating the interlayer insulation film 22 and the interlayer insulation film 23 was formed and the surface of the barrier metal film 32 was exposed on the bottom portion of the cylinder hole 92 (FIG. 28). Then, the ruthenium film 41 was formed as the lower electrode according to the spattering method and CVD method (FIG. 29). After that, the ruthenium film at the upper portion of the hole was removed according to the CMP method (FIG. 30). The interlayer insulation film 22 was removed by wet etching so as to obtain a pedestal (column-like) lower electrode (FIG. 31). After that, the ruthenium film 41 was treated by heat in hydrogen (diluted by 20% nitrogen) in order to improve its orientation property.

Figure 32:
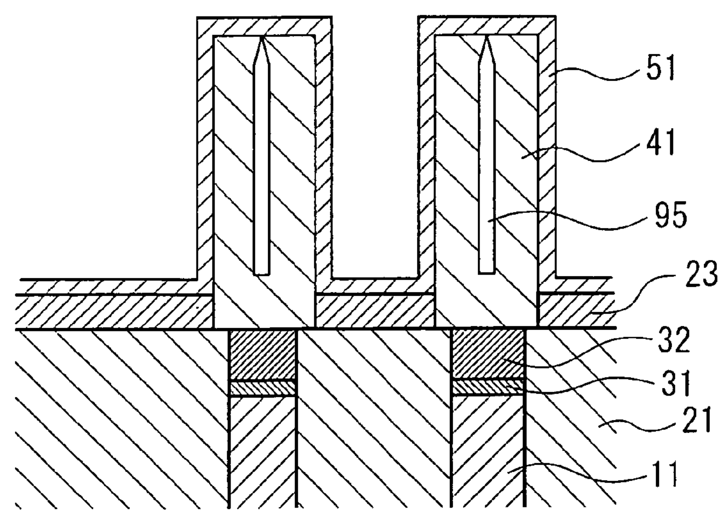
FIG. 32 is a sectional view showing the manufacturing step of the capacitor according to the third embodiment of the present invention.
Figure 33:
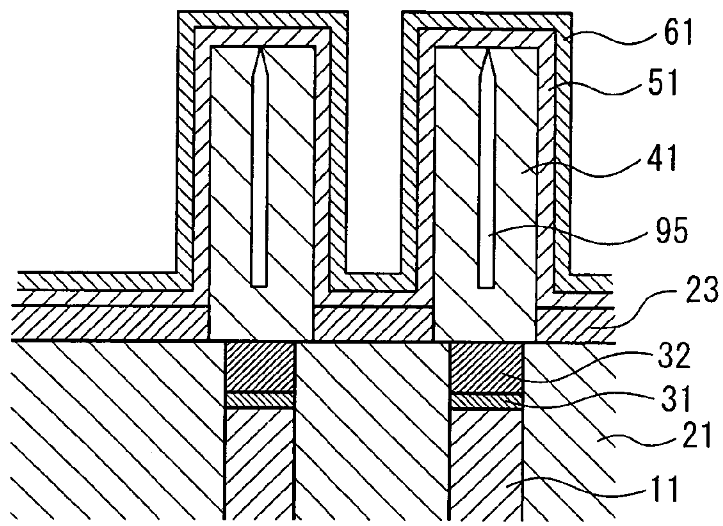
FIG. 33 is a sectional view showing the manufacturing step of the capacitor according to the third embodiment of the present invention.
Figure 34:
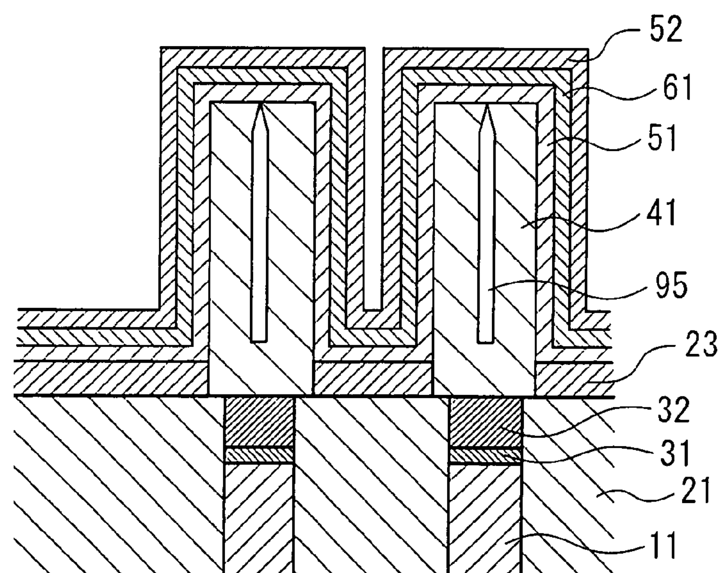
FIG. 34 is a sectional view showing the manufacturing step of the capacitor according to the third embodiment of the present invention.
Figure 35:
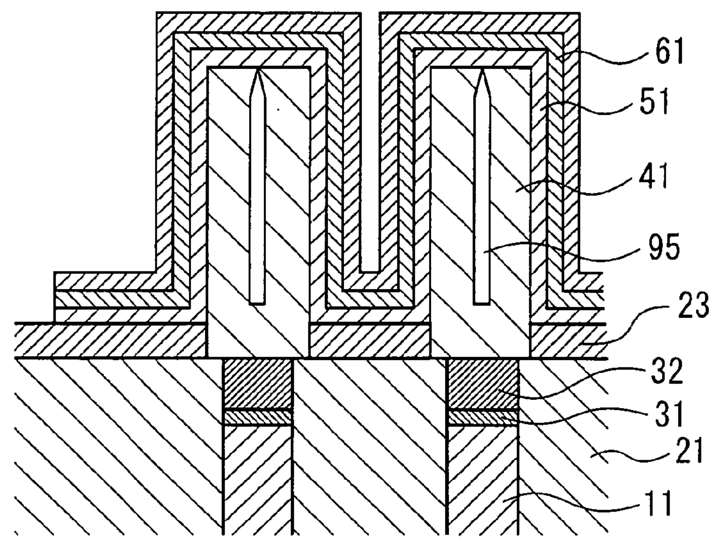
FIG. 35 is a sectional view showing the manufacturing step of the capacitor according to the third embodiment of the present invention.
Figure 36:
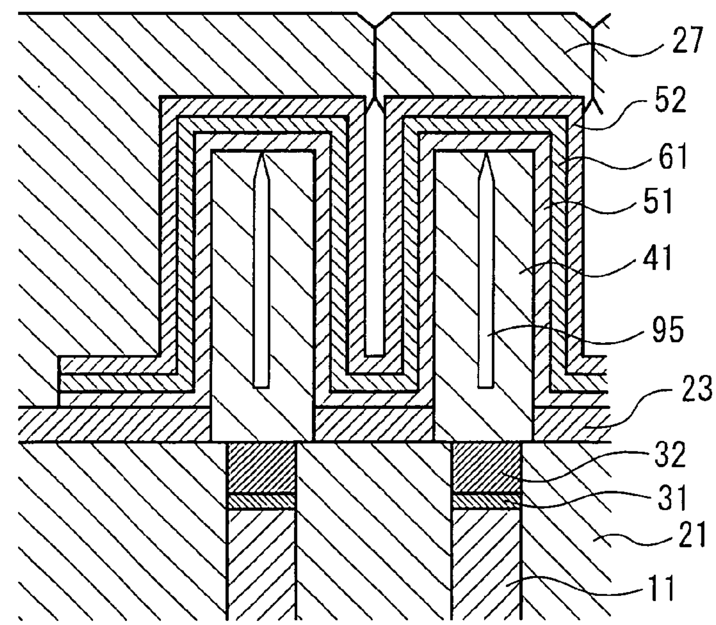
FIG. 36 is a sectional view showing the manufacturing step of the capacitor according to the third embodiment of the present invention.
Figure 37:
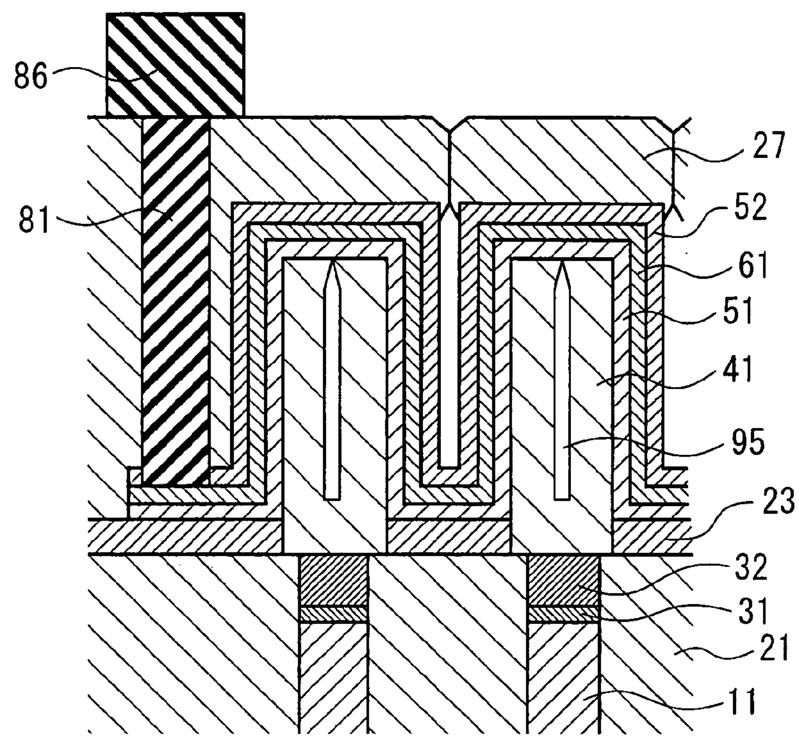
FIG. 37 is a sectional view showing the manufacturing step of the capacitor according to the third embodiment of the present invention.

Next, the tantalum film 51 having a thickness of 15 nm was formed according to the CVD method and treated with heat in the atmosphere of ozone at 410° C. for 10 minutes in order to reform the tantalum oxide film 51 (FIG. 32). Subsequently, the ruthenium film 61 was formed as the upper electrode according to the spattering method and CVD method (FIG. 33). After the second ruthenium film 52 was formed as the upper electrode protective film (FIG. 34), the second tantalum film 52 and the ruthenium film 61 were processed into a desired upper electrode shape (FIG. 35). After that, the interlayer insulation film 27 was formed (FIG. 36), and the connection plug 81 was embedded in an open connection hole and the first layer wiring 86 is formed and as a consequence, a capacitor having the structure shown in FIG. 37 was obtained.

(2) Characteristic Evaluation and Result of Analysis

Figure 38:
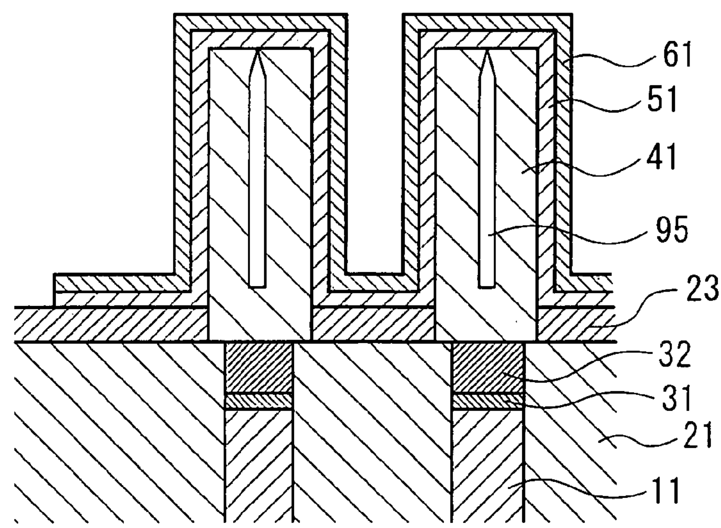
FIG. 38 is a sectional view showing the fourth conventional MIM type capacitor.

The I-V characteristic of the capacitor was investigated. Like the first embodiment, a difference in leak current was recognized depending on whether or not the upper electrode protective film (tantalum oxide film) was present. That is, although in the conventional example having no upper electrode protective film (FIG. 38), the leak current before treatment with hydrogen was less than 1 e-9 A/cm$^2$ (at ±1V), the leak current increased up to 5 e-7 A/cm$^2$ after treatment with hydrogen (at 450° C. for 30 minutes).

Not only if the lower electrode structure is in the shape of a cup but also if it is of pedestal (column-like) structure, there is an effect of preventing the ruthenium film of the upper electrode from being altered by etching processing.

The present invention is not restricted to the above-described embodiments, but it is evident that the respective embodiments may be modified appropriately within the scope of technical philosophy of the present invention.

What is claimed is:

1. A manufacturing method of a semiconductor device comprising a memory selection MISFET formed on a main surface of a semiconductor substrate and a capacitor having a lower electrode electrically connected to one of source and drain of said memory cell selection MISFET, an upper electrode and a capacity insulation film provided between said lower electrode and said upper electrode, the method comprising the steps of:

forming said capacity insulation film;

forming said upper electrode film on said capacity insulation film;

forming an insulative upper electrode protective film having a same shape as said upper electrode film so as to be in contact with said upper electrode film; and etching said upper electrode protective film and said upper electrode film into a shape of said upper electrode.

2. The manufacturing method of a semiconductor device according to claim 1, wherein said capacity insulation film is a tantalum oxide film.

3. The manufacturing method of a semiconductor device according to claim 1, wherein said upper electrode film is a ruthenium film.

4. The manufacturing method of a semiconductor device according to claim 1, wherein said upper electrode film is a laminated film of a ruthenium film and a tungsten film.

5. The manufacturing method of a semiconductor device according to claim 4, wherein said tungsten film is formed using spattering method.

6. The manufacturing method of a semiconductor device according to claim 1, wherein said upper electrode protective film is formed using CVD method.

7. The manufacturing method of a semiconductor device according to claim 1, wherein said upper electrode protective film is a tantalum oxide film.

8. The manufacturing method of a semiconductor device according to claim 7, wherein said tantalum oxide film is formed by using pentaethoxy tantalum ($Ta(OC_2H_5)_5$) and oxygen as material gas.

9. The manufacturing method of a semiconductor device according to claim 7, wherein the formation of said tantalum oxide film comprises the first film formation step and the second film formation step, a film formation speed of which is higher than that of the first film formation step.

10. The manufacturing method of a semiconductor device according to claim 9, wherein a film formation temperature of the first film formation step is lower than that of the second film formation step.

11. The manufacturing method of a semiconductor device according to claim 9, wherein an oxygen flow rate of the first film formation step is smaller than that of the second film formation step.

12. The manufacturing method of a semiconductor device according to claim 9, wherein a film formation temperature of the first film formation step is 350–400° C.

13. The manufacturing method of a semiconductor device according to claim 9, wherein a film thickness formed in the first film formation step is 0.1–2nm.

14. A manufacturing method of a semiconductor device comprising a memory selection MISFET formed on a main surface of a semiconductor substrate and a capacitor having a lower electrode electrically connected to one of source and drain of said memory cell selection MISFET, an upper electrode and a capacity insulation film provided between said lower electrode and said upper electrode, the method comprising the steps of:

forming said capacity insulation film;

forming said upper electrode film on said capacity insulation film;

forming an upper electrode protective film as to be in contact with said upper electrode film; and etching said upper electrode protective film and said upper electrode film into a shape of said upper electrode, wherein said upper electrode protective film is formed without oxidation of said upper electrode film.

15. The manufacturing method of a semiconductor device according to claim 1, wherein said upper electrode protective film is formed in an oxidation atmosphere.

16. The manufacturing method of a semiconductor device according to claim 1, wherein said upper electrode protective film is formed at a temperature of equal to or lower than 500° C.

17. The manufacturing method of a semiconductor device according to claim 1, wherein said upper electrode protective film is formed without using ozone.

18. A manufacturing method of a semiconductor device comprising a memory selection MISFET formed on a main surface of a semiconductor substrate and a capacitor having a lower electrode electrically connected to one of source and drain of said memory cell selection MISFET, an upper electrode and a capacity insulation film provided between said lower electrode and said upper electrode, the method comprising the steps of:

forming said capacity insulation film;

forming said upper electrode film on said capacity insulation film;

forming an upper electrode protective film so as to be in contact with said upper electrode film; and etching said upper electrode protective film and said upper electrode film into a shape of said upper electrode, wherein said upper electrode protective film is an aluminum oxide film.

19. The manufacturing method of a semiconductor device according to claim 18, wherein said aluminum oxide film is formed using trimethyl aluminum ($Al(CH_3)_3$) and oxygen as material gas.

20. The manufacturing method of a semiconductor device according to claim 18, wherein said aluminum oxide film is formed using trimethyl aluminum ($Al(CH_3)_3$) and ozone as material gas.

21. The manufacturing method of a semiconductor device according to claim 1, wherein said etching processing step comprises the steps of:

applying photo resist, exposing said photo resist film to light and developing;

etching said upper electrode protective film with said photo resist film as a mask;

removing said photo resist film; and etching said upper electrode film with said upper electrode protective film as a mask.

* * * * *